(12) United States Patent
Peng et al.

(10) Patent No.: US 10,694,621 B1
(45) Date of Patent: Jun. 23, 2020

(54) IMAGE CAPTURING ASSEMBLY AND ELECTRONIC DEVICE INCLUDING THE SAME

(71) Applicants: INVENTEC (PUDONG) TECHNOLOGY CORPORATION, Shanghai (CN); INVENTEC CORPORATION, Taipei (TW)

(72) Inventors: Chi-Zen Peng, Taipei (TW); Chia-Chen Chen, Taipei (TW); Pin-Chang Chu, Taipei (TW); Ting-Yuan Lin, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/566,534

(22) Filed: Sep. 10, 2019

(30) Foreign Application Priority Data

May 28, 2019 (CN) .......................... 2019 1 0452114

(51) Int. Cl.
| | |
|---|---|
| G06F 1/16 | (2006.01) |
| H05K 1/02 | (2006.01) |
| H05K 1/18 | (2006.01) |
| H04N 5/225 | (2006.01) |
| H04R 1/02 | (2006.01) |
| H01R 12/72 | (2011.01) |

(52) U.S. Cl.
CPC ......... *H05K 1/0278* (2013.01); *G06F 1/1616* (2013.01); *G06F 1/1684* (2013.01); *G06F 1/1686* (2013.01); *H04N 5/2252* (2013.01); *H04N 5/2253* (2013.01); *H04R 1/02* (2013.01); *H05K 1/189* (2013.01); *H01R 12/722* (2013.01); *H04R 2201/02* (2013.01); *H04R 2499/15* (2013.01); *H05K 2201/10083* (2013.01); *H05K 2201/10121* (2013.01); *H05K 2201/10128* (2013.01); *H05K 2201/10189* (2013.01)

(58) Field of Classification Search
CPC ...... G06F 1/1616; G06F 1/162; G06F 1/1622; G06F 1/1686
USPC ........................................ 361/679.27, 679.23
See application file for complete search history.

(56) References Cited

U.S. PATENT DOCUMENTS

| | | | |
|---|---|---|---|
| 7,019,784 B1* | 3/2006 | Shibuya ................ | G06F 1/1616 348/207.1 |
| 7,948,752 B2* | 5/2011 | Tatsukami ............ | G06F 1/1616 348/207.1 |
| 2011/0091051 A1* | 4/2011 | Thomason ............ | G06F 1/1616 381/103 |
| 2011/0285859 A1* | 11/2011 | Lin ....................... | G06F 1/1686 348/207.1 |
| 2012/0105400 A1* | 5/2012 | Mathew ............... | H04N 5/2251 345/207 |

(Continued)

*Primary Examiner* — Anthony Q Edwards
(74) *Attorney, Agent, or Firm* — Maschoff Brennan

(57) ABSTRACT

An image capturing assembly including a composite circuit board, an image capturing component and a first audio component. The composite circuit board includes a hard board part and a first flexible board part that are directly connected to each other. The image capturing component is disposed on and electrically connected to the hard board part. The first audio component is disposed on and electrically connected to the first flexible board part.

10 Claims, 4 Drawing Sheets

(56) References Cited

U.S. PATENT DOCUMENTS

| | | | |
|---|---|---|---|
| 2012/0236195 A1* | 9/2012 | Chang | G06F 1/1686 348/333.06 |
| 2014/0016031 A1* | 1/2014 | Tsai | G06F 1/1686 348/376 |
| 2016/0191769 A1* | 6/2016 | Yeh | H04N 5/2254 348/47 |
| 2017/0351164 A1* | 12/2017 | Kim | G03B 17/08 |
| 2019/0033927 A1* | 1/2019 | Youm | G06F 1/1618 |
| 2019/0082083 A1* | 3/2019 | Jarvis | H04N 5/2253 |
| 2019/0250453 A1* | 8/2019 | Honda | G02F 1/1345 |
| 2020/0092447 A1* | 3/2020 | Fletcher | G06K 9/00255 |

\* cited by examiner

IMAGE CAPTURING ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 201910452114.2 filed in China, on May 28, 2019, the entire contents of which are hereby incorporated by reference.

BACKGROUND OF THE INVENTION

Technical Field of the Invention

The disclosure relates to an image capturing assembly and an electronic device including the same, more particularly to an image capturing assembly having a composite circuit board and an electronic device including such image capturing assembly.

Description of the Related Art

Recently, electronic devices for displaying images are desired to be light and thin while have a variety of functions and improved performance and convenience. Also, the display of the electronic devices is also desired to be light and thin while have a variety of functions and improved performance and convenience.

SUMMARY OF THE INVENTION

One embodiment of this disclosure provides an image capturing assembly including a composite circuit board, an image capturing component and a first audio component. The composite circuit board includes a hard board part and a first flexible board part that are directly connected to each other. The image capturing component is disposed on and electrically connected to the hard board part. The first audio component is disposed on and electrically connected to the first flexible board part.

Another embodiment of this disclosure provides an electronic device including a casing, and an image capturing assembly. An inner surface of the casing includes a first inner surface and a second inner surface that are connected to each other. The first inner surface and the second inner surface are not parallel to each other. The image capturing assembly is disposed in the casing and the image capturing assembly includes, a composite circuit board, an image capturing component and a first audio component. The composite circuit board includes a hard board part and a first flexible board part that are directly connected to each other. The hard board part and the first flexible board part are respectively attached to the first inner surface and the second inner surface. The image capturing component is disposed on and electrically connected to the hard board part. The first audio component is disposed on and electrically connected to the first flexible board part.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
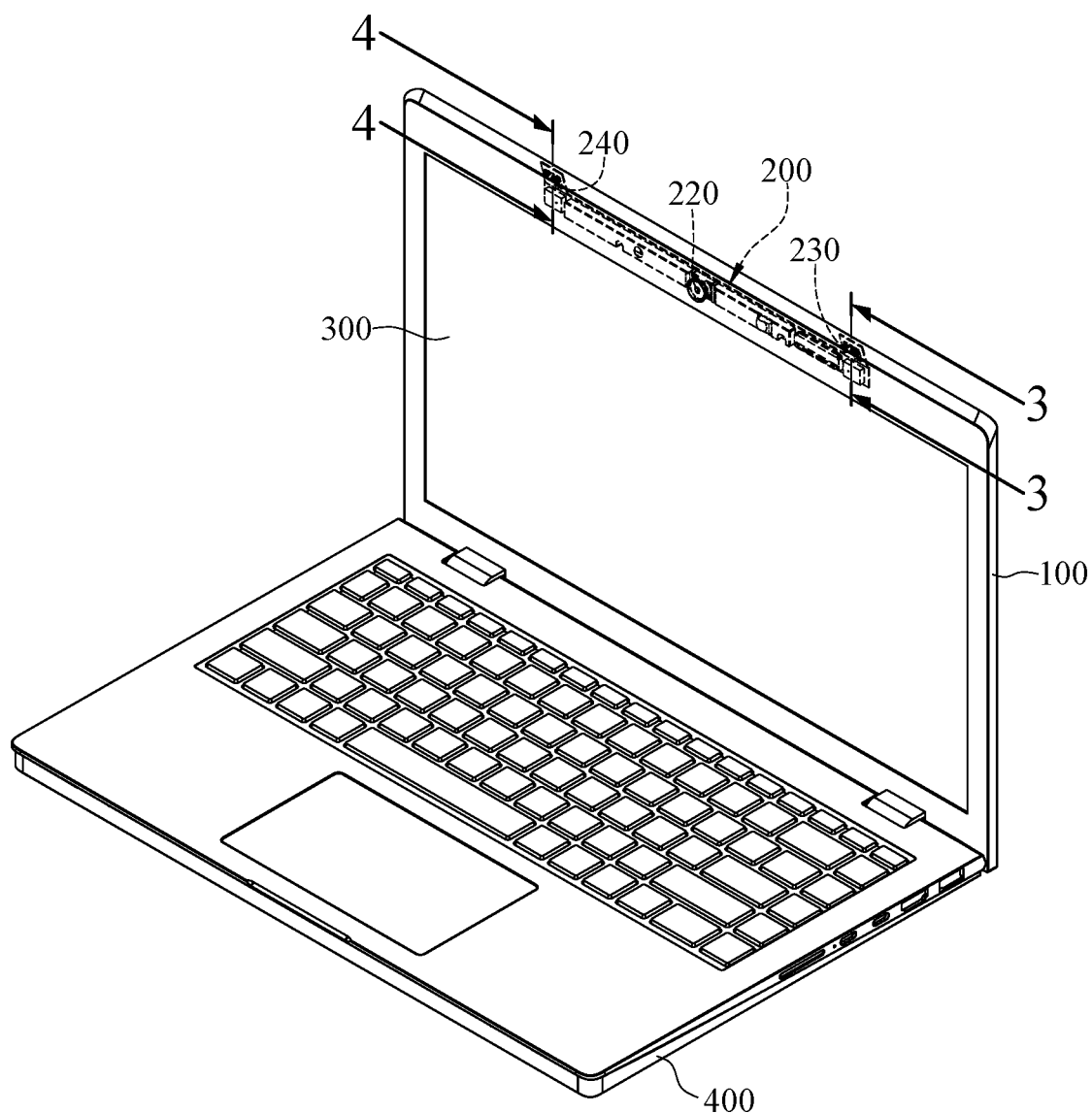
FIG. 1 is perspective view of an electronic device according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
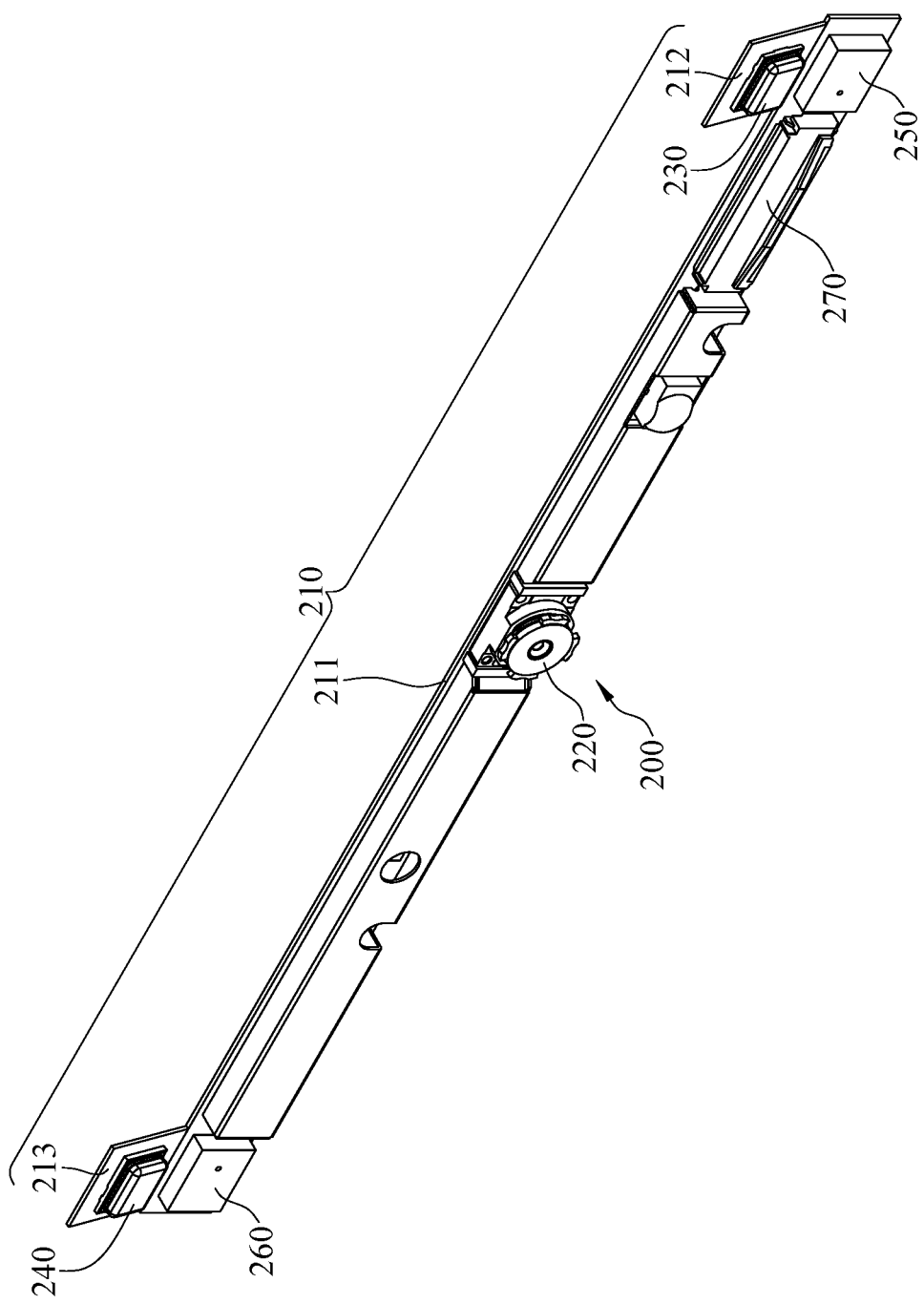
FIG. 2 is a perspective view of an image capturing assembly of the electronic device in FIG. 1.
Figure 3:
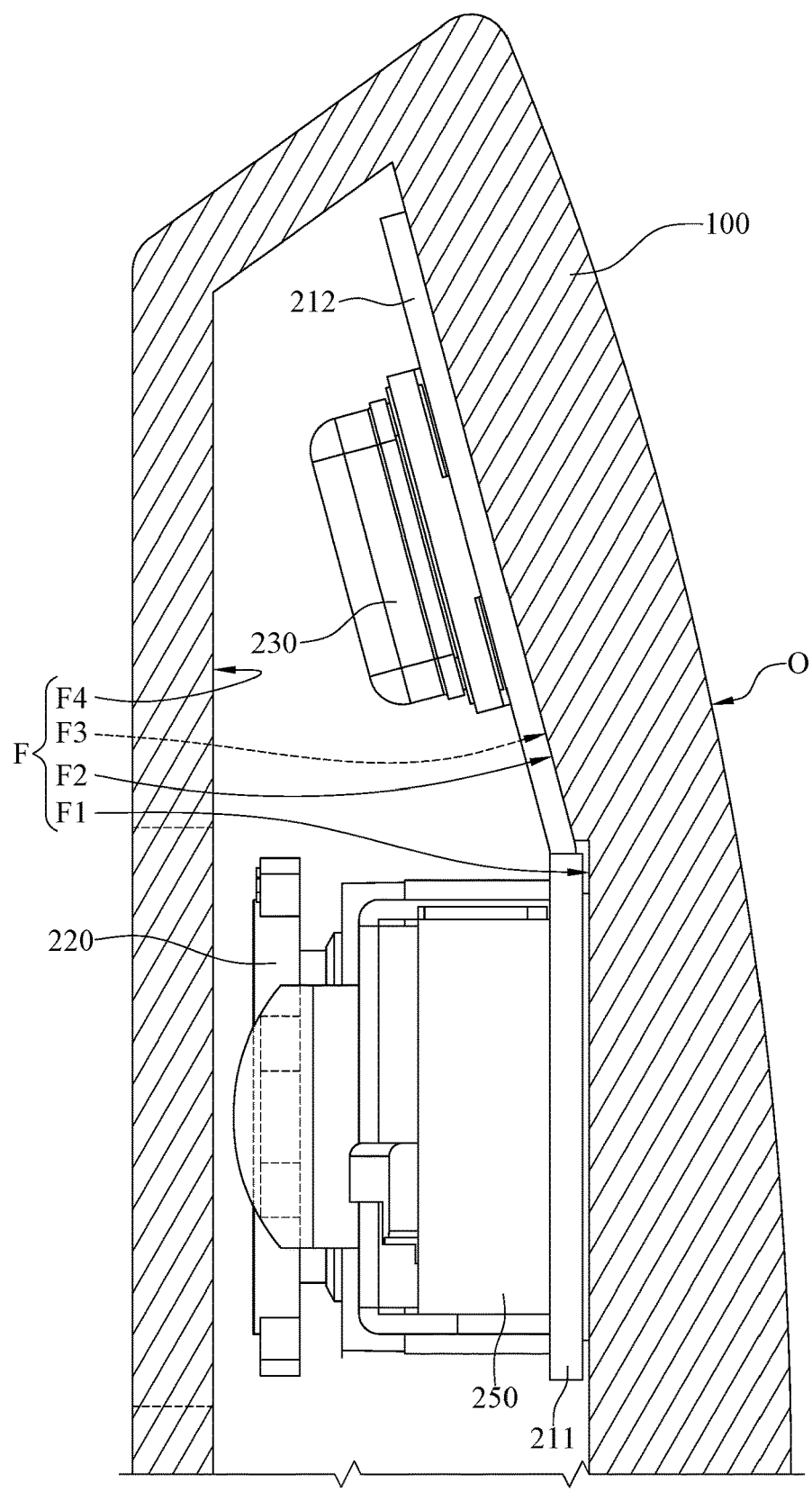
FIG. 3 is a partially enlarged cross-sectional view of the electronic device taken along line 3-3 in FIG. 1.
Figure 4:
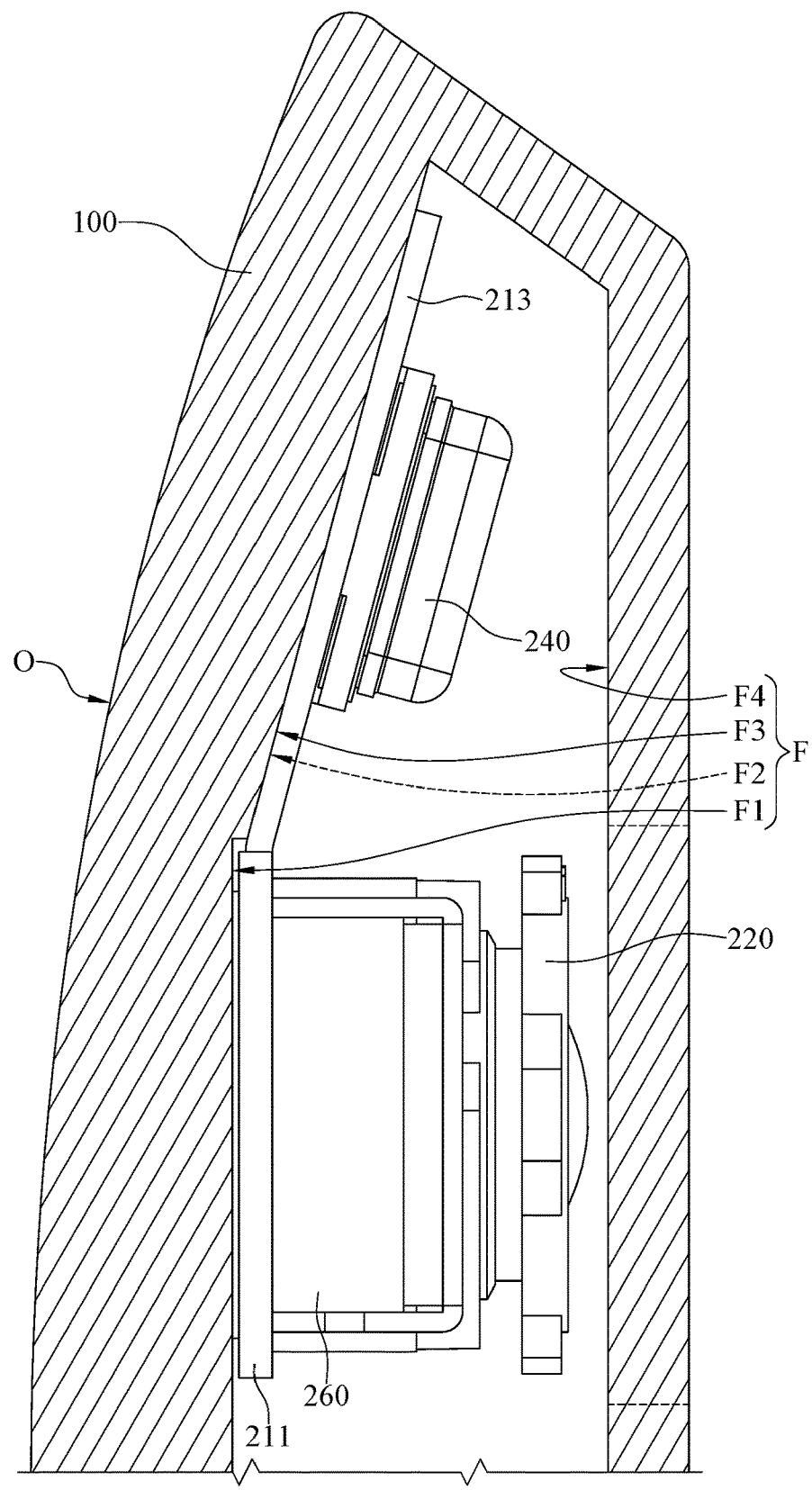
FIG. 4 is a partially enlarged cross-sectional view of the electronic device taken along line 4-4 in FIG. 1.

Please refer to FIG. 1 to FIG. 4, where FIG. 1 is perspective view of an electronic device 10 according to one embodiment of the invention, FIG. 2 is a perspective view of an image capturing assembly 200 of the electronic device 10 in FIG. 1, FIG. 3 is a partially enlarged cross-sectional view of the electronic device 10 taken along line 3-3 in FIG. 1, and FIG. 4 is a partially enlarged cross-sectional view of the electronic device 10 taken along line 4-4 in FIG. 1. For the purpose of clear illustration, the wiring of the electronic device 10 are omitted from the drawings.

As shown in FIG. 1, FIG. 3 and FIG. 4, the electronic device 10 includes a casing 100, an image capturing assembly 200, a display device 300 and a base 400. The image capturing assembly 200 and the display device 300 are disposed on the casing 100. The base 400 is pivotally connected to the casing 100.

The casing 100 has an inner surface F and an outer surface O. The inner surface F includes a first inner surface F1, a second inner surface F2, a third inner surface F3 and a fourth inner surface F4. The first inner surface F1, the second inner surface F2 and the third inner surface F3 are located between the fourth inner surface F4 and the outer surface O. The first inner surface F1 is parallel to the fourth inner surface F4. The first inner surface F1 is directly connected to the second inner surface F2. The first inner surface F1 is not parallel to the second inner surface F2. The first inner surface F1 is directly connected to the third inner surface F3. The first inner surface F1 is not parallel to the third inner surface F3. That is to say, the first inner surface F1 is not coplanar to the third inner surface F3. The second inner surface F2 and the third inner surface F3 are coplanar. The casing 100 include at least one side part (not labeled) and one of the side parts has a rounded or sloped edge. The first inner surface F1 is not located on that side part, and the second inner surface F2 and the third inner surface F3 are locate on that side part of the casing 100, but the invention is not limited thereto; in other embodiments, the second inner surface and the third inner surface may be located at another side part of the casing that has a rounded or sloped edge.

The electronic device 10 is, for example, a laptop computer, but the invention is not limited thereto. The display device 300 is disposed on a side of the casing 100. In other embodiments, the electronic device 10 may not include the display device 300. In still another embodiment, the electronic device 10 may be a display and not include the base 400, but the invention is not limited thereto.

As shown in FIG. 2, the image capturing assembly 200 includes a composite circuit board 210, an image capturing component 220, a first audio component 230, a second audio component 240, a third audio component 250, a fourth audio component 260 and a connector 270. The image capturing component 220, the first audio component 230, the second audio component 240, the third audio component 250, the third audio component 250 and the connector 270 are disposed on and electrically connected to the composite circuit board 210.

The composite circuit board 210 includes a hard board part 211, a first flexible board part 212 and a second flexible board part 213. The hard board part 211 is directly connected to the first flexible board part 212. In concrete, the first flexible board part 212 is directly connected to a side of the hard board part 211. The first flexible board part 212 can be bent to have an angle to the hard board part 211. The hard board part 211 and the first flexible board part 212 are respectively attached to the first inner surface F1 and the second inner surface F2. That is, the composite circuit board 210 including the hard board part 211 and the first flexible board part 212 can be attached to two adjacent surfaces that are not parallel to each other, and electronic or electrical components can be respectively disposed on the hard board part 211 and the first flexible board part 212. Therefore, the electronic or electrical components are allowed to be positioned in the relatively small internal corners in the casing, thereby improving the space utilization efficiency of the electronic device 10. That is, the image capturing assembly 200 is not limited to be disposed on a flat surface and is allowed to be simultaneously installed on multiple non-coplanar surfaces.

The hard board part 211 is, for example, directly connected to the second flexible board part 213. In concrete, the second flexible board part 213 is directly connected to the other side of the hard board part 211. The second flexible board part 213 can be bent to have an angle to the hard board part 211. The hard board part 211 and the second flexible board part 213 are respectively attached to the first inner surface F1 and the third inner surface F3. That is, the composite circuit board 210 including the hard board part 211 and the second flexible board part 213 can be attached to two adjacent surfaces that are not parallel to each other, and the electronic or electrical components can be respectively disposed on the hard board part 211 and the second flexible board part 213. Therefore, the electronic or electrical components are allowed to be position in the relatively small internal corners in the casing, thereby improving the space utilization efficiency of the electronic device 10. That is, the image capturing assembly 200 is not limited to be disposed on a flat surface and is allowed to be simultaneously installed on multiple non-coplanar surfaces.

The hard board part 211 is, for example, a rectangular board. In other embodiments, the hard board part 211 may be in other shapes according to actual requirements. The first flexible board part 212 and the second flexible board part 213 are, for example, square boards. In still another embodiment, the first flexible board part 212 and the second flexible board part 213 may be in other shapes according to actual requirements. In other embodiments, the electronic device 10 may not include the second flexible board part 213. In another embodiment, the first flexible board part 212 and the second flexible board part 213 may be directly connected to other positions of the hard board part 211 according to actual requirements. In still yet another embodiment, the hard board part 211, the first flexible board part 212 and the second flexible board part 213 may be respectively disposed on three surfaces that are not parallel to one another, and that is, the second flexible board part 213 may be respectively disposed on three surfaces that are not coplanar to one another.

The image capturing component 220 is disposed on and electrically connected to the hard board part 211. The image capturing component 220 has components that enable the image capturing function such as an electronic assembly and lens. The image capturing component 220 is disposed on the center of the hard board part 211. In other embodiments, the image capturing component 220 may be disposed on another position of the hard board part 211 based on actual requirements.

The first audio component 230 is disposed on and electrically connected to the first flexible board part 212. The second audio component 240 is disposed on and electrically connected to the second flexible board part 213. The first audio component 230 is, for example, a microphone and is configured to receive external sound coming from, for example the rear side of the display device 300 that faces away from a display surface (not labeled) of the display device 300.

The second audio component 240 is, for example, a microphone and is configured to receive external sound coming from, for example, the front side of the display device 300 where the display surface is located. In other embodiments, the second audio component 240 may be omitted. In still another embodiment, other required or suitable components may be disposed on the second flexible board part 213.

The third audio component 250 is disposed on and electrically connected to the hard board part 211. The third audio component 250 is located adjacent to the first audio component 230. The third audio component 250 is, for example, a microphone and is configured to receive external sound coming from, for example, the front side of the display device 300. In other embodiments, the third audio component 250 may be disposed on a position that is located away from the first audio component 230 based on actual requirements. In another embodiment, the third audio component 250 may be omitted.

The fourth audio component 260 is disposed on and electrically connected to the hard board part 211. The fourth audio component 260 is located adjacent to the second audio component 240. The fourth audio component 260 is, for example, a microphone and is configured to receive external sound coming from, for example, the front side of the display device 300. In other embodiments, the fourth audio component 260 may be disposed on a position that is located away from the second audio component 240 based on actual requirements. In another embodiment, the fourth audio component 260 may be omitted.

The connector 270 is disposed on the hard board part 211. The connector 270 is configured to be electrically connected to the electrical system of the electronic device 10. The connector 270 is, for example, a card edge connector. In other embodiments, the connector 270 may be any other suitable types of connector that can be electrically connected to the electrical system of the electronic device 10. In other embodiments, the electronic device 10 may further include other required or suitable electrical or electronic components disposed on and electrically connected to the hard board part 211.

Please refer to FIG. 3 and FIG. 4 again. The aforementioned first audio component 230 disposed on the first flexible board part 212 is located between the second inner surface F2 and the fourth inner surface F4. Similarly, the second audio component 240 is located between the third inner surface F3 and the fourth inner surface F4. The third audio component 250 is located between the first inner surface F1 and the fourth inner surface F4. Similarly, the fourth audio component 260 is located between the first inner surface F1 and the fourth inner surface F4.

The hard board part 211 and the first flexible board part 212 are respectively attached to the first inner surface F1 and the second inner surface F2 that are not parallel to each other. The image capturing component 220 and the first audio component 230 are respectively disposed on the hard board part 211 and the first flexible board part 212 that are not parallel to each other. The first audio component 230 is allowed to be not disposed on the hard board part 211. The first audio component 230 is disposed on the first flexible board part 212, such that the first audio component 230 may be disposed on the first inner surface F1 and the second inner surface F2 that are not coplanar to each other, where the second inner surface F2 is located on that side part having the rounded or sloped edge. In this way, the space utilization efficiency of the electronic device can be enhanced. That is, the audio components can be disposed in the smaller corner of the casing 100, such that the thinning of the image capturing assembly and electronic device including the same can be performed.

Similarly, the hard board part 211 and the second flexible board part 213 are respectively attached to the first inner surface F1 and the third inner surface F3 that are not parallel to each other, and the image capturing component 220 and the second audio component 240 are respectively disposed on the hard board part 211 and the second flexible board part 213 that are not parallel to each other. The second audio component 240 is allowed to be not disposed on the hard board part 211. The second audio component 240 is disposed on the second flexible board part 213, such that the second audio component 240 may be disposed on the first inner surface F1 and the third inner surface F3 that are not coplanar to each other, where the third inner surface F3 is located on the top part having the rounded or sloped edge. In this way, the space utilization efficiency of the electronic device can be enhanced. In this way, the audio components can be disposed in the smaller corner of the casing 100, such that the thinning of the image capturing assembly and electronic device including the same can be performed.

According to the image capturing assembly discussed above, since the composite circuit board included in the image capturing assembly includes the hard board part and the flexible board part, the image capturing assembly can be attached to two surfaces that are not parallel to each other via the hard board part and the flexible board part that are not parallel to each other. In this way, the image capturing assembly is not limited to be disposed on a flat surface. In addition, since the audio component is disposed on the flexible board part, the audio component can be located on smaller corner of the side part of the casing that has the rounded or sloped edge, thereby enhancing the space utilization efficiency of the electronic device. That is, the thinning of the image capturing assembly and the electronic device including the same can be performed.

According to the electronic device discussed above, since the composite circuit board included in the image capturing assembly includes the hard board part and the flexible board part, the image capturing assembly can be attached to two surfaces that are not parallel to each other via the hard board part and the flexible board part that are not parallel to each other. In this way, the image capturing assembly is not limited to be disposed on a flat surface. In addition, since the audio component is disposed on the flexible board part, the audio component can be located on smaller corner of the side part of the casing that has the rounded or sloped edge, thereby enhancing the space utilization efficiency of the electronic device. That is, the thinning of the image capturing assembly and the electronic device including the same can be performed.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An image capturing assembly, comprising:
   a composite circuit board, comprising a hard board part and a first flexible board part that are directly connected to each other;
   an image capturing component, disposed on and electrically connected to the hard board part; and
   a first audio component, disposed on and electrically connected to the first flexible board part.

2. The image capturing assembly according to claim 1, further comprising a second audio component, wherein the composite circuit board further comprises a second flexible board part, the second flexible board part is directly connected to the hard board part, and the second audio component is disposed and electrically connected to the second flexible board part.

3. The image capturing assembly according to claim 1, further comprising a third audio component and a fourth audio component that are disposed on and electrically connected to the hard board part.

4. The image capturing assembly according to claim 1, further comprising a connector disposed on the hard board part.

5. An electronic device, comprising:
   a casing, wherein an inner surface of the casing comprises a first inner surface and a second inner surface that are connected to each other, and the first inner surface and the second inner surface are not parallel to each other; and
   an image capturing assembly, disposed in the casing and the image capturing assembly comprising:
      a composite circuit board, comprising a hard board part and a first flexible board part that are directly connected to each other, the hard board part and the first flexible board part respectively attached to the first inner surface and the second inner surface;
      an image capturing component, disposed on and electrically connected to the hard board part; and
      a first audio component, disposed on and electrically connected to the first flexible board part.

6. The electronic device according to claim 5, wherein the inner surface of the casing further comprises a third inner surface directly connected to and not parallel to each other the first inner surface, and the third inner surface and the second inner surface are coplanar.

7. The electronic device according to claim 6, wherein the composite circuit board further comprises a second flexible board part, the second flexible board part is directly connected to the hard board part, and the hard board part and the second flexible board part are respectively attached to the first inner surface and the third inner surface.

8. The electronic device according to claim 7, wherein the image capturing assembly further comprises a second audio component disposed on and electrically connected to the second flexible board part.

9. The electronic device according to claim 5, further comprising a display device disposed in the casing.

10. The electronic device according to claim 5, further comprising a base pivotally connected to the casing.

\* \* \* \* \*